United States Patent [19]

Wiegman et al.

[11] 4,349,893
[45] Sep. 14, 1982

[54] MEMORY WITH CURRENT-CONTROLLED SERIAL-TO-PARALLEL CONVERSION OF MAGNETIC FIELD DOMAINS

[75] Inventors: Nelie J. Wiegman; Karel E. Kuijk, both of Eindhoven, Netherlands

[73] Assignee: U.S. Philips Corporation, New York, N.Y.

[21] Appl. No.: 166,509

[22] Filed: Jul. 7, 1980

[30] Foreign Application Priority Data

Jul. 17, 1979 [NL] Netherlands ................... 7905543

[51] Int. Cl.³ ............................................ G11C 19/08
[52] U.S. Cl. ............................................... 365/20
[58] Field of Search ............................. 365/19, 20, 21

[56] References Cited

U.S. PATENT DOCUMENTS

| | | | |
|---|---|---|---|
| 3,506,975 | 4/1970 | Bobeck et al. | 365/19 |
| 4,218,762 | 8/1980 | Haisma et al. | 365/19 |
| 4,229,805 | 10/1980 | Breed | 365/19 |

Primary Examiner—James W. Moffitt
Attorney, Agent, or Firm—James J. Cannon, Jr.

[57] ABSTRACT

A device for magnetic domains contains at least two, meander-shaped, current conductors for the purpose of driving parallel domains along these conductors by means of respective currents in them that alternate cyclically. At at least one end the current conductors are connected to a third current conductor. The latter is either also meander-shaped or it acts in the same way as a meander-shaped conductor with respect to the domains. Conversion is possible between parallel drive along the first and second conductors and serial drive along the third conductor owing to the fact that a loop of the latter also forms part of the other conductors.

6 Claims, 5 Drawing Figures

MEMORY WITH CURRENT-CONTROLLED SERIAL-TO-PARALLEL CONVERSION OF MAGNETIC FIELD DOMAINS

BACKGROUND OF THE INVENTION

The invention relates to a device for the storage of digital information in the form of magnetic domains in magnetizable layer under the control of a bias field transverse to the layer, further comprising driving means in the form of at least one current conductor which has at least a partially meander-like shape and can be driven by a periodical electric current, for producing a track along the meander-shaped part of it for the magnetic domains. Such a device is known from the U.S. Pat. No. 4,157,591 (see for example FIG. 8). The known device has a mixed drive mechanism, i.e. is driven partially by means of a periodical electric current in a meander-shaped conductor, and by a magnetic field rotating in the plane of the plate of magnetizable material, namely along a track that is determined by a series of I-, T-, and Y-shaped elements of permalloy. As described in the above literature reference, both the drive mechanisms have their advantages. The drive with a rotating field is very attractive for low bit frequencies. For high bit frequencies the drive with a rotating magnetic field is no longer possible, and a current-controlled drive has been to be used. There is a disadvantage here, however, that the dissipation is then also high. This applies very much to completely serially organized memories with a large storage capacity that work completely with current drive. The state of the art relevant to this invention is exemplified in a paper by E. Dekker, et al, "Combination of Field and Current Access Magnetic Bubble Circuits", IEEE Transactions-Magnetics, MAG-13, No. 5 (September 1977), pages 1261–1263.

SUMMARY OF THE INVENTION

It is the object of the invention to achieve a reduction in the necessary dissipation in the case of a memory that is energized by meander-shaped conductors, and to do this without the need of two different drive mechanisms, and also to achieve a high storage density by parallel techniques (information per surface area). The invention achieves this object in that said current conductor which is electrically singly interconnected has at least first and second meander-shaped paths running in parallel and also a third conductor path transverse to these which, by means of a sequence of alternating currents within it produces a path along it for the magnetic domains, and for conversion between serial and parallel drive of the domains said first and second meander paths are connected to the third conductor path because a first and second loop of the third conductor path form, as terminal loops, part of said first and second meander paths respectively. If a domain is present in such a terminal loop, then it can be dispatched by energizing of one of the two conductor paths of which the relevant loop forms part. Transport towards this loop can take place in a corresponding manner. The third conductor path may, in practice, be a meander path that is connected in series with respect to a power source. It is possible, on the other hand, that this conductor path acts as a meander path only for the domains and as a large number of parallel connected conductor loops for the power source, as will be discussed in greater detail below.

Advantageously, said current conductor also has a fourth conductor path in parallel with the third conductor path which, by means of a sequence of alternating currents in it, produces a path along it for the magnetic domains, and for an intermediate parallel organized storage in said first and second meander paths the latter are connected to the fourth conductor path in that a third and fourth loop of the fourth conductor path form, as further terminal loops, part of said first and second meander paths respectively. Thus the first and second parallel meander paths are terminated at both ends by the third and fourth conductor paths respectively. It is found that storage and drive of the domains on the first and second meander paths respectively consume only little energy because, although these paths represent a relatively large part of the total storage capacity, they are only energized for a small part of the number of cycles of the current in the conductor (the duty cycle is low).

FURTHER ASPECTS OF THE INVENTION

Each of the respective meander paths can be energized by means of its own separately led-out terminals. It is also advantageous if at least said third conductor path forms a third meander path, and if said terminal loops are connected via a resistor to a joint current connection for the first and second meander paths on said magnetizable layer. Thus said joint current connection does not form a short-circuit with respect to the third conductor path, while a configuration contained entirely within one (printed) wiring layer can still be used.

It is advantageous if said third conductor path contains a plurality of sub-paths, each containing at least one said terminal loop, and each having a first subconnection and a second subconnection, and if all said first subconnections are connected to one another and all said second subconnections are connected to one another on the plate of magnetizable material so as to form a separate first and second main connection respectively. This prevents the need for the above resistors and dissipation is lower. The drive then becomes somewhat more complicated.

It is advantageous if said first and second meander paths form a mirror image of one another at least over a first part of their length. In the mirrored part the tolerances in the dimensions of the meanders are found to be larger so that fewer faults occur in manufacture. In the first place an adjacent first and second meander conductor may be mirrored over their entire length. However, the transfer with third and fourth conductor paths respectively is then not always the same because the final loops are also mirrored. It is advantageous therefore if said first and second meander paths have a different cycle length over a second part of their length, namely between said first part and a terminal loop of a pair of adjacent final loops, and if said pair of terminal loops have corresponding shapes. The non-mirrored part of the first and second meander conductors is relatively small which means that the chance of faults is not much larger. And because of the corresponding orientations of the final loops completely parallel transfer of the domains is possible.

SHORT DESCRIPTION OF THE FIGURES

FIG. 1 gives a first embodiment of a device according to the invention.

FIG. 2 gives a second embodiment of a device according to the invention.

FIG. 3 gives a third embodiment of a device according to the invention.

FIG. 4 gives details of the embodiment of FIG. 2.

FIG. 5 is a diagram showing the driving of the device in FIG. 4.

DESCRIPTION OF THE PREFERRED EMBODIMENTS

Figure 1:
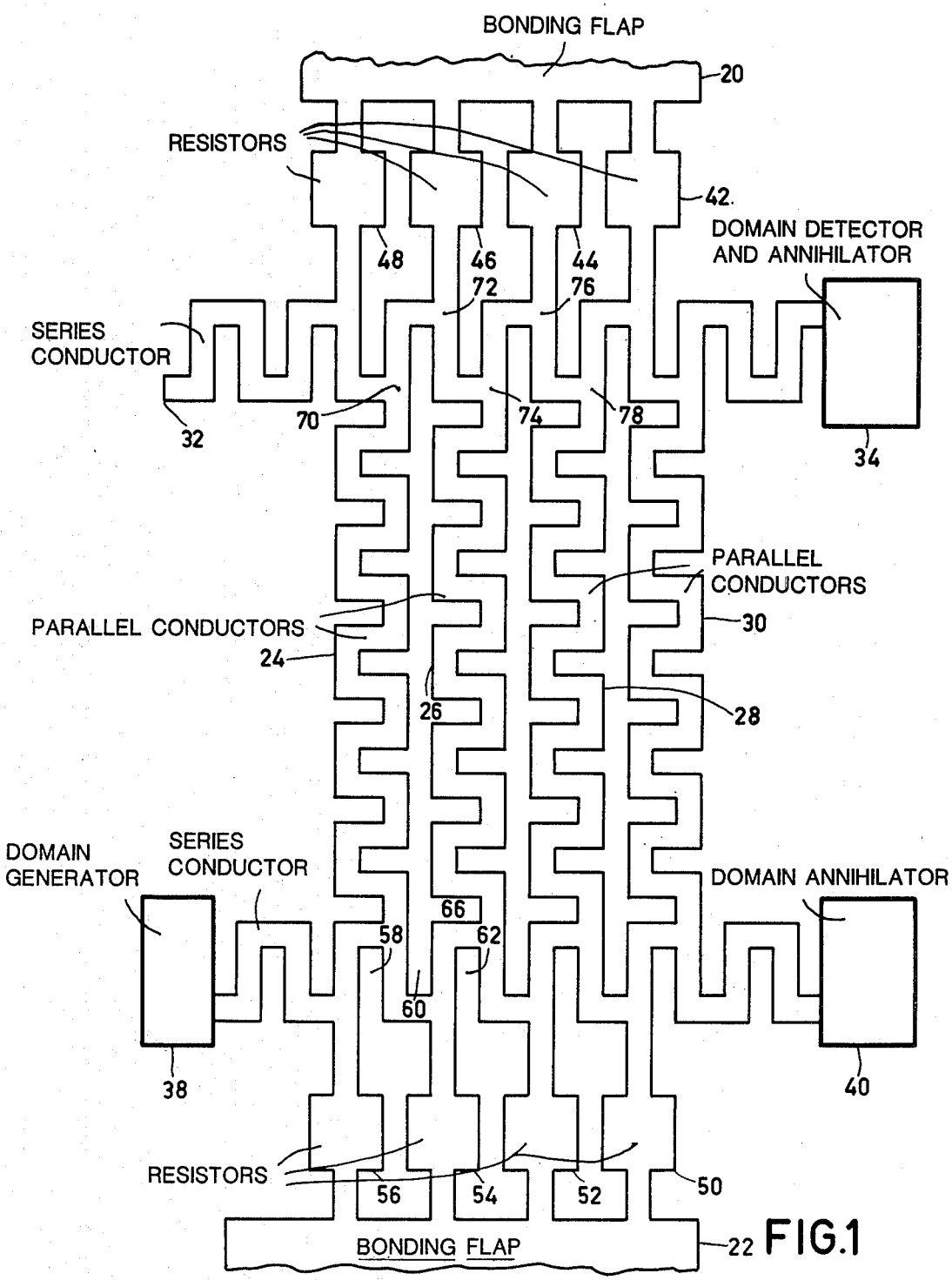

FIG. 1 illustrates a first embodiment of a device according to the invention. In this embodiment the device has six meander paths, running, respectively, from position 32 to element 34 and from element 38 to element 40 (these two are the series conductors) and the meander paths 24, 26, 28, 30 (these are the parallel conductors). The conductors are applied, for example, by sputtering onto the plate of magnetizable material (ferrimagnetic). For brevity, the construction of this plate is not treated in detail. In principle, the method of said sputtering is known. The plate of magnetic material may contain domains which are sustained by a bias field of, say, a permanent magnet. Sometimes a static field component is present in the plane of the plate. This means therefore that the bias magnetic field is not precisely perpendicular. The meander paths 24, 26, 28, 30 are connected by means of resistors 42 to 56 to the bonding flaps 20, 22. These resistors can be applied in a known manner, for example by "thin film" techniques. The bonding flaps themselves may contain a specific site for the soldering (bonding) of a current conductor owing to the fact, for example, that such a site has been widened, thickened or given a gold coating. The series conductors are either connected jointly or not jointly in an appropriate manner to bonding flaps (not shown). At places where a series conductor and a parallel conductor cross one another they are interconnected to one another. Thus the conductor section between points 72 and 74 forms both part of the upper series conductor and the parallel conductor 26. Elements 38 is a known type domain generator which can be energized by current connections (not shown). The domains produced are driven by a cyclic current in the lower series conductor in the direction of element 40. If a domain is present in loop 60 and the bias field in loop 62 is lowered by a current in the series conductor, then the relevant domain will go to loop 62 because, among other things, the bias field in loop 60 is raised by this same current. The domain does not go to loop 58 because, due to elements of permalloy (not shown), there is a preference for one drive direction. Similar elements also determine a preferred direction for the drive along the entire meander conductors in each half-cycle. Such elements may be formed in all kinds of ways, for example by ion implantation, difference in height in the plate of magnetic material and other methods. This is treated more in detail in FIG. 4. Element 40 is a domain annihilator, and if no further control takes place, the domains are finally driven in this direction. By either energizing, or not, the domain generator 38 in a given cycle of the cyclic current in the lower series conductor either a domain is generated in the flow of information (1) or no domain is generated (0). If a domain is present in loop 62 and the parallel conductor 26 is energized in such a way that the bias field is reduced in loop 66, then the relevant domain moves to this loop 66. In the same way as the series conductor, the parallel conductors are also provided with small elements of permalloy to give a preferred direction to the drive of the domains. It is clear, therefore, that all the domains are taken over into the parallel meander paths if each four cycles of energization of the series conductors are always followed by one cycle of energization of the parallel conductors. As a result of this the total dissipation in the drive structure illustrated in FIG. 1 is relatively low. It has generally been found that in the case of a relatively low drive frequency the dissipation per cycle of the drive is approximately constant: certain minimum values have to be exceeded in the duration and height of the current pulses in the meander conductors (an example of the current wave form is shown in FIG. 5). Above a certain critical frequency (in domains of four micron cross-section this frequency is often in the vicinity of 1 MHz) the dissipation per cycle increases rapidly so that this region is usually avoided. Let there be m parallel meander paths each containing p cycles of the conductors while, displaced each time by one cycle, they are connected to the series conductors. The storage capacity is therefore $m \times p$ bits. There is then an alternation of dissipation: first m cycles of m units of dissipation for the series conductor; than one cycle of $m \times p$ units of dissipation in the parallel conductor. The total dissipation for the storage of m bits is then: $m.(m+p)$ units of dissipation, for one bit: $(m+p)$ units of dissipation. This increases therefore less rapidly than linearly with the storage capacity of the device if m and p do not differ too much from one another. Usually they will be selected approximately equal to one another. This disregards the dissipation in the second series conductor, in the parts of series conductor that are not connected to the parallel conductors, and in resistors 42 through 56. The average dissipation needed for the storage of one information bit can be compared with the energy needed for a completely serially organized domain memory built entirely of a single meander conductor. For a capacity of $(m \times p)$ bits (mp) units of dissipation are each time required for the storage of each bit. The memory described works a little less fast than the fully serially organized memory. This amounts to a factor $m : (m+1)$ which, in practice, is very close to one. If after a number of drive cycles the domains in the parallel conductors 24 to 30 reach the top series conductor they can be transported by a cyclic current contained in this series conductor towards element 34. Element 34 is a known type domain detector with a domain annihilator. The connections for feed currents and output signals to element 34 are not given for brevity. At the other end of the top series conductor there is at point 32 a bonding flap (not shown). The current connections of the upper and lower series conductors may be connected through to one another if this does not cause any short-circuiting of the currents in the parallel conductors. A counter-measure can then be found in elements corresponding to resistors 42 to 56 (see below). The series conductors and parallel conductors are all physically connected to one another by, for example, connections 70 to 78. This has the advantage that all the meander conductors may all be present in a single wiring layer. This means that a small number of manufacturing stages is sufficient to produce them. At the other end the low-ohmic bonding flaps 20, 22 must not form a short-circuit during the energization of the series conductors. This is achieved by resistors 42 through 56. The value of these resistors must be large enough for the current loss through the bonding flap to be disregarded with respect to the current in the series conductor. On the other hand, these resistors must not be so large that the dissipation in them becomes too high. An acceptable compromise is frequently obtained when the resistance of one parallel conductor is approximately equal to the sum of the resistance of two resistors connected in series with it. There are then for example 32 parallel conductors for each 32 cycles of the meander structure. The dissipation for each each bit supplied is then doubled to approximately (2m+2p) because the second series conductor also makes a contribution (m) and the resistors as well as the parallel conductors (p). The input and output parts of the series conductors are disregarded. The dissipation is less than the value (m×p) for a serial memory of the same size. Another solution is as follows. In place of each of the resistors 42 to 48 inclusive there is an identical parallel conductor to the parallel conductors 24 through 30. The series conductor between 32 and 34 appears twofold, once in a suitable form for outputting and detecting the domains, as drawn, and once in the manner of the bottom series conductor in FIG. 1 for generating and coding information. The bit frequency for input and output is then increased. The contribution to the dissipation that comes from resistors 42 through 56 is now halved. For the through-connected series conductors isolating series resistors must also be present for which the same design considerations apply as for those provided to the parallel conductors.

Figure 2:
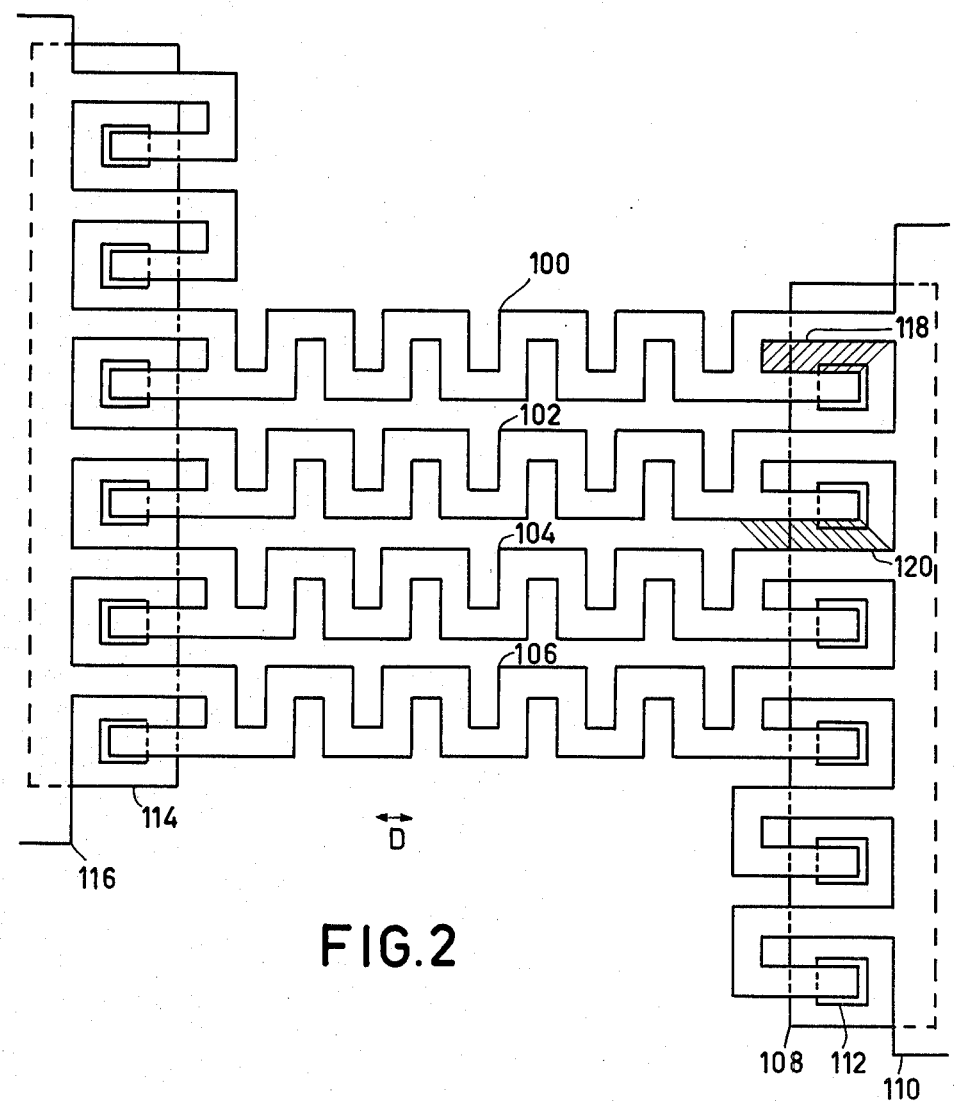

FIG. 2 illustrates a second embodiment of a device according to the invention. The above-mentioned resistors are now avoided, but this time an additional measure has been taken in that four bonding flaps have been provided for the parallel conductors. Once again there are four parallel conductors 100, 102, 104, 106. On the right is a lower bonding flap 108 which is shown in its entirety. On to it has been applied an isolating layer (not shown). For every period of the series conductor this layer has an opening (for example 112) passing through which there is a conducting connection to the upper conductor layer and thus to the upper bonding flap (110). The latter is shown broken off. Where the upper conductor layer covers the lower bonding flap, the latter is drawn with a broken line. In this embodiment the domain generator, the domain detector and the domain annihilator(s) have not been indicated. The parallel conductors are energized by connecting a current generator to the bonding flaps 110, 116. The bonding flaps 108, 114 remain therefore unconnected. If the right-hand series conductor has been energized, an alternating current generator is connected between the two bonding flaps 108 and 110. In a first half cycle of this alternating current the bias field is attenuated, in the hatched area 118, for example, owing to the fact that the current follows a "U"-shaped path in the upper wiring layer. The currents in the two conductor tracks along the area 120 hatched in the reverse manner are then directed in such a way that the bias field is intensified. In the next half cycle the current direction is reversed and thus the bias field is attenuated in the hatched area 120. Driving is again achieved by means of small elements of permalloy (not shown). The left-hand half of the device is of similar design. In a similar manner it is possible for the bonding flaps 108 and 114 to form the upper wiring layer. In general it is advantageous if the meander conductors are located tightly on the layer of magnetizable materials because the dissipation may then be lower. In this case the design of the interconnecting hole is also somewhat different, but taken separately, this design is already known. The advantage of the configuration in FIG. 2 is that no isolating resistors are needed for the parallel conductors. There is no technological problem in itself in making such resistors: it is easy to produce such a resistor that has twenty times as high a resistance as that of the material of the conductors (the resistance of one cycle of these conductors is of the order of 1 ohm) but then the dissipation per surface area is much greater which means that considerable gradients in temperature can occur.

In the configuration shown in FIG. 2 it may happen in certain cases that the resistance of the parallel-connected loops of the series conductors is too low to provide a good match with the current generator for this purpose. In this case it is possible, for example, to make an interruption in the bonding flaps 108, 110, while half of each of the two flaps is connected through to the non-corresponding flap of the other (thus for example the upper half of 108 is connected to the lower half of 110). The non-linked halves then form the connections. In some cases isolating resistors are again needed, even though fewer, because all the parallel conductors still have a joint connection. This can produce a suitable compromise between FIG. 1 and FIG. 2.

Figure 3:
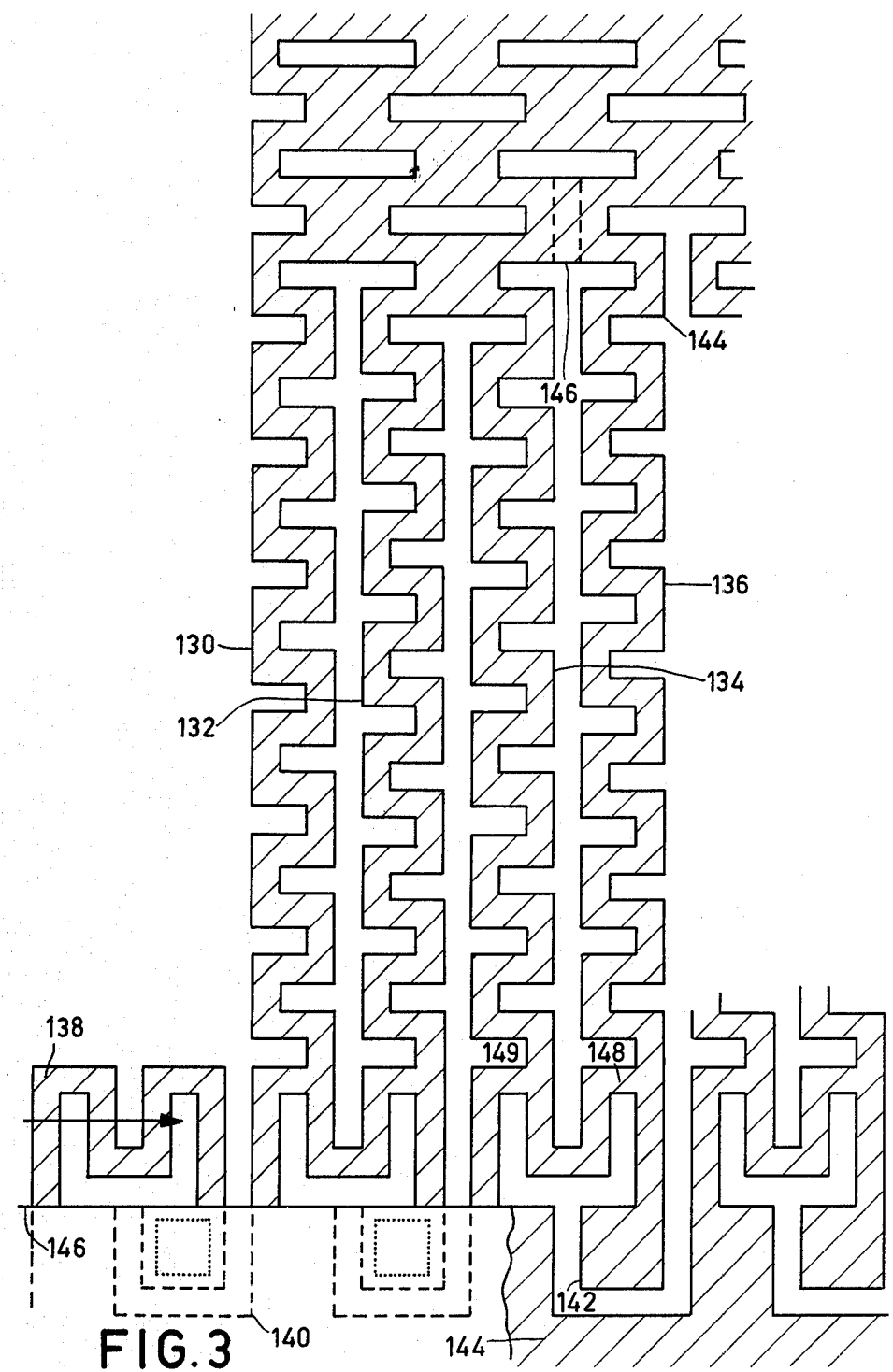

FIG. 3 illustrates a third embodiment of a device according to the invention. It shows four parallel conductors 130 through 136 and one series conductor 138 (for the sake of simplicity the other has been omitted). The series conductor is divided into sub-paths all of the same shape, the speed of which is equal to two cycles of the meander conductor. At position 140 a through connection has been drawn between upper and lower wiring layer. For a domain diameter of 1 micron the longitudinal cycle of all the meander conductors is equal to 4 micron. For the through connection the wiring layer of the parallel conductors (see for examples at 142) has connecting pieces of 3×3 micron. In the case of a minimum detail in the wiring of 1 micron a recess is provided for this in this same layer (the lower one in this case) of 4×5 micron. At 140 is indicated in broken lines the connecting piece and the associated recess. The hole in the isolating intermediate layer between the upper and the lower wiring layers is indicated locally in dashed lines as a square of 2×2 micron. The upper wiring layer is bounded, for example, by the line 146 and extends downwards in the figure. The other limits of this wiring layer have not been given. A voltage between upper and lower wiring layers then energizes two cycles of the series conductor resulting in a higher impedance compared with FIG. 2. Because of the increased period of the connection of the series conductor more space is now also available for such a connection. It is small disadvantage that, when the parallel conductors are energized, slight asymmetry occurs in the energization. In this case the bonding flap 144 is energized. Due partly to the piece at 148 the parallel conductors 134 and 136 do not now have precisely the same impedance. Furthermore, during energization, the circuit current around the loop is greater at 149 than it is at 148. In certain cases this can produce a narrowed tolerance range for the bias field. The said asymmetries become larger if the sub-paths have more cycles than shown in FIG. 3.

A further difference between FIG. 3 and the preceding figure is the fact that the parallel conductors 130 and 134 have over a part of their lengths a cycle that is about 10% greater than that of the other two, so that above position 144 they are in opposite phase to one another. At 146 the "normal" condition is indicated in broken lines. If the parallel conductors are energized, the currents on both sides of the broken lines are directed in parallel. Furthermore, there is no voltage difference between the relevant areas. Although the bottom area of, for example, parallel conductor 136 has a half cycle more, the cycles of, for example, parallel conductor 134 due to their increased lengths have an inherently greater resistance. Use is made of this zero potential difference by filling the space between adjacent parallel conductors with conductor material so as to produce a simple layout. As a result of this fewer faults will occur in manufacture. This simple layout applies to a relatively large part of the structure. Where the parallel conductors have a length of 32 cycles, the "hole plate" is present over 20 cycles. It is clear that at the upper side of the structure a transition region with shifted cycles is again present so as to obtain correct connection to the series conductor. On the other hand, the parallel conductors may also be mirrored over their entire length, but then not all transfer mechanisms between the series and parallel drives are the same.

Figure 4:
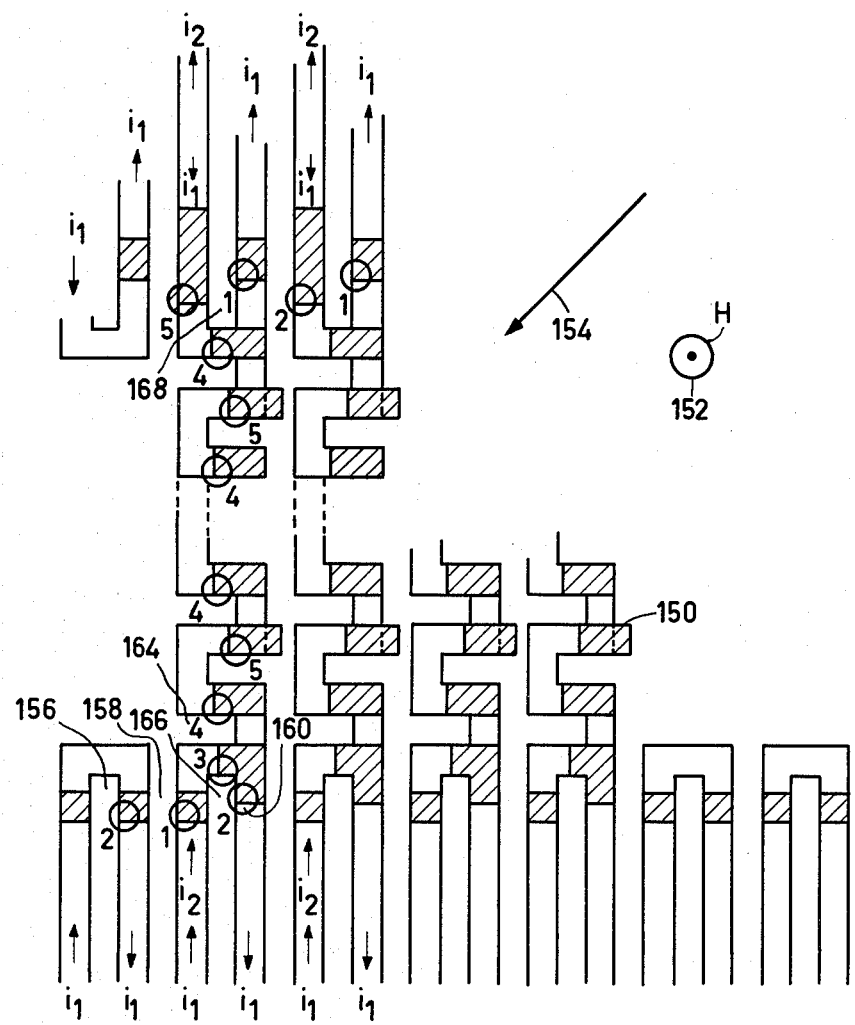
Figure 5:
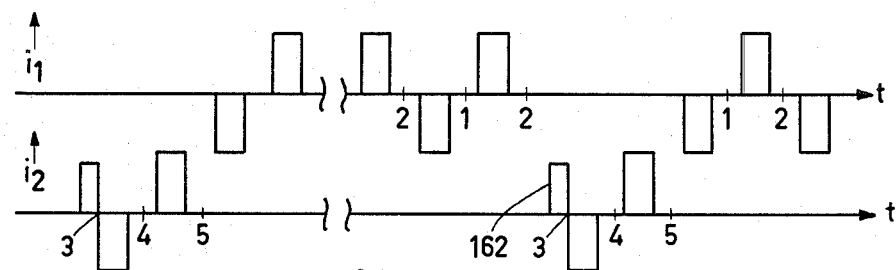

FIG. 4 gives further details relating to the embodiment illustrated in FIG. 2. The figure gives a top view of the drive structure. The hatched parts illustrate small elements of permalloy for creating permanent preferred positions for the domains when there is no current energization. The thickness of the permalloy is the same as that of the conductor layer for domains with a diameter of 1 micron, approximately 0.2–0.4 micron. Further prior art techniques are known for providing such preferred positions, for example by ion implantation. The meander conductors are shown unhatched. At certain points, for example at position 150, permalloy elements protrude locally from out of the conductor path. The current connections have the form shown in FIG. 2 (single loops in the series conductors). The direction of the bias field is upward as indicated at point 152. In addition, there is a small field component in the plane of the plate of the order of about 15% of the strength of the bias field. The direction of this is indicated at point 154. In certain cases this in-plane field is not necessary. For the sake of simplicity domain generators, annihilators, detectors, bonding flaps and the like have been omitted. In this connection FIG. 5 gives an energization diagram for FIG. 4, the top row representing the currents through the series conductors and the bottom row the currents through the parallel conductors. A number of domain positions (with the domains to scale) are also given. The figures at the domain positions refer to points on the time axis in FIG. 5. By means of a positive current pulse 11 (according to the arrows) in the series conductor the bias field is attenuated at point 156. At the end of such a current pulse a preferred position occurs at "2" as a result of the influence of the field component according to arrow 154 on the permalloy. By means of a subsequent negative current pulse in the series conductor the bias field is attenuated at 158 and a preferred position now obtained at "1". After another positive current pulse, position 160 ("2") is reached. A positive pulse with comparable duration and amplitude (162) to said pulses in the series conductor is then applied to the parallel conductors as a result of which the bias magnetic field at point 164 is intensified and is attenuated at point 166, i.e. directly at the edge of the part of conductor that is horizontal in the figure. After the end of this current pulse the domain is then present there at position "3". As a result of an immediately following negative (against the direction of the arrow) current pulse in the parallel conductors, the field at point 164 is attenuated and the domain is then present at point "4". After a positive current pulse again the domain is one half cycle further at position "5". If, after a last positive pulse in the parallel conductors at the top end, a domain has arrived at a position 5, transfer into the series conductor is again possible. Due to a negative pulse in the series conductor the main field is attenuated at point 168 and there is a preferred position at "1". After a positive current pulse in the series conductor there is then a preferred position at "2" (this corresponds, again, to a "5" position). The two series conductors can be energized together again.

What is claimed is:

1. Device for the storage of digital information in the form of magnetic domains in a magnetizable layer under the control of a bias field transverse to the layer, containing, in addition, driving means in the form of at least one current conductor applied to said layer that can be driven by a cyclic electric current and has at least a meander-shaped part, wherein a path along the meander-shaped part of it is intended for the magnetic domains, in which said current conductor which is electrically singly connected comprises at least first and second parallel meander paths running in parallel and also a third conductor path transverse to these which, by means of a sequence of alterating currents in it, produces a path along it for the magnetic domains, and in which for conversion between serial and parallel drive of the domains said first and second meander paths are connected to the third conductor path owing to the fact that a first and second loop of the third conductor path form, as terminal loops, part of said first and second meander paths respectively.

2. Device as claimed in claim 1, in which said current conductor also includes a fourth conductor path running parallel with the third conductor path which, by means of a sequence of alternating currents in it, produces a path along it for the magnetic domains, and in which for an intermediate parallel organized storage in said first and second meander paths the latter are connected to the fourth conductor path owing to the fact that a third and fourth loop of the fourth conductor path form, as further terminal loops, part of said first and second meander paths respectively.

3. Device as claimed in claim 1 or 2, in which at least said third conductor path forms a third meander path, and said terminal loops are connected via a resistor to a current connection on said magnetizable layer that is common to first and second meander paths.

4. Device as claimed in claim 1 or 2, in which said third conductor path comprises a number of sub-paths each containing at least one said terminal loop and each with a first subconnection and a second subconnection, and in which all said first subconnections are connected to one another and all second subconnections are connected to one another on the plate of magnetizable material to form separate first and second main connections respectively.

5. Device as claimed in one of claims 1 or 2, in which the first and second meander paths form a mirror image of one another over a first part of their length.

6. Device as claimed in claim 5, in which said first and second meander paths have a different cycle length over a second part of their length, namely between said first part and terminal loops lying adjacent to each terminal loop of a pair, and in which said pair of final loops is formed correspondingly.

* * * * *